United States Patent
Priel et al.

(10) Patent No.: US 9,906,355 B2
(45) Date of Patent: Feb. 27, 2018

(54) ON-DIE SIGNAL MEASUREMENT CIRCUIT AND METHOD

(71) Applicants: Michael Priel, Netanya (IL); Leonid Fleshel, Hertzelia (IL); Roman Mostinski, Jerusalem (IL); Vladimir Nusimovich, Hertzelia (IL)

(72) Inventors: Michael Priel, Netanya (IL); Leonid Fleshel, Hertzelia (IL); Roman Mostinski, Jerusalem (IL); Vladimir Nusimovich, Hertzelia (IL)

(73) Assignee: NXP USA, Inc., Austin, TX (US)

( * ) Notice: Subject to any disclaimer, the term of this patent is extended or adjusted under 35 U.S.C. 154(b) by 258 days.

(21) Appl. No.: 14/758,973

(22) PCT Filed: Jan. 9, 2013

(86) PCT No.: PCT/IB2013/050184
§ 371 (c)(1),
(2) Date: Jul. 2, 2015

(87) PCT Pub. No.: WO2014/108742
PCT Pub. Date: Jul. 17, 2014

(65) Prior Publication Data
US 2015/0338464 A1 Nov. 26, 2015

(51) Int. Cl.
| | | |
|---|---|---|
| *H04L 7/00* | (2006.01) | |
| *G11C 19/00* | (2006.01) | |
| *G01R 31/317* | (2006.01) | |
| *G01R 31/28* | (2006.01) | |

(52) U.S. Cl.
CPC ............ *H04L 7/00* (2013.01); *G01R 31/2837* (2013.01); *G01R 31/2884* (2013.01); *G01R 31/31712* (2013.01); *G11C 19/00* (2013.01)

(58) Field of Classification Search
CPC ..... H04L 7/00; G11C 19/00; G01R 31/31712; G01R 31/2837; G01R 31/2884
See application file for complete search history.

(56) References Cited

U.S. PATENT DOCUMENTS

| | | | | |
|---|---|---|---|---|
| 5,701,335 | A | * 12/1997 | Neudeck | G11C 19/00 377/69 |
| 6,608,721 | B1 | 8/2003 | Turpin et al. | |
| 7,332,916 | B2 | 2/2008 | Nagata | |
| 7,453,255 | B2 | 11/2008 | Sunter et al. | |
| 7,478,011 | B2 | 1/2009 | Gebara et al. | |

(Continued)

FOREIGN PATENT DOCUMENTS

KR      20080064261      7/2008

OTHER PUBLICATIONS

International Search Report and Written Opinion correlating to PCT/IB2013/050184 dated Nov. 26, 2013.

*Primary Examiner* — Ajay Ojha (57) ABSTRACT

There is provided a method, apparatus and integrated circuit for measuring a signal, the apparatus comprising a plurality of sample stages arranged in series, each sample stage comprising a delay element, and a sample element, wherein an input of the sample element is coupled to an output of the delay element, and a strobe line for controlling a sample time of the sample elements, the strobe line comprising a plurality of strobe delay elements arranged in series, wherein an output of each strobe delay element is coupled to one or more sample elements.

14 Claims, 7 Drawing Sheets

(56) References Cited

U.S. PATENT DOCUMENTS

| | | |
|---|---|---|
| 7,619,404 B2 | 11/2009 | Laberge |
| 7,724,811 B2 * | 5/2010 | Ichiyama ......... G01R 31/31709 |
| | | 324/750.3 |
| 2006/0269031 A1 * | 11/2006 | Eckhardt .................. H04L 7/00 |
| | | 375/371 |
| 2007/0091991 A1 | 4/2007 | Sartschev et al. |
| 2014/0184243 A1 * | 7/2014 | Iyer ................. G01R 31/31708 |
| | | 324/620 |

* cited by examiner

ON-DIE SIGNAL MEASUREMENT CIRCUIT AND METHOD

FIELD OF THE INVENTION

This invention relates to the measurement or sampling of signal levels, and in particular, but not exclusively to a method and apparatus for performing sampling of signal levels on an integrated circuit using on-chip functionality.

BACKGROUND OF THE INVENTION

Modern integrated circuits contain many high frequency, high accuracy analog elements such as phase lock loops, LVDS, DDR PHY/IO, etc. It can be difficult to accurately measure such signals during testing and characterization of new integrated circuits, or chips. This can make debugging of circuits difficult and requires the use of expensive test equipment, along with expenditure of significant resources and time.

In some cases test equipment operating externally to the integrated circuit requires complicated synchronization to enable reading of the signals to be tested within a very small measurement window. This is complicated the difficulty in allowing internal signals of the integrated circuit to be read externally to the chip, for example to allow triggering of a measurement based on a different signal. Thus, it is necessary to trigger measurements based on some external timing which may not be accurately synchronized to the event that it is desired to measure.

Furthermore, while the value of a signal at a specified point in time can be measured by the test equipment, it is not possible to measure a time when a switching event occurs. Rather, multiple measurements must be taken, and the data searched for the desired event. Due to the time delays and latencies involved with the use of external test equipment, this makes it difficult to determine an exact time the event occurs, particularly in a modern circuit which may be operating an GHz frequencies.

Due to the above difficulties, characterization and testing of integrated circuit designs can currently require many man months of time to be spent by specialist engineers, which is expensive and may still not result in a fully accurate characterization of the circuit being tested.

SUMMARY OF THE INVENTION

The present invention provides an integrated circuit and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Modern integrated circuits operate within very aggressive performance requirements in a number of key performance aspects, such as frequency, power, signal latency, etc. Verifying that an integrated circuit is able to meet these requirements within the required tolerances is difficult and expensive. In many cases, measurement of critical signals may be effectively impossible external to the integrated circuit as, by routing the critical signal outside of the integrated circuit, more uncertainty may be introduced into the signal than the required accuracy of the measurement to be made.

One proposal for the measurement of non-periodic signals is to use a 'on-die scope', whereby a signal to be measured is sampled using a tapped delay line. This allows a number of samples of the signal to be taken with a very small time step between each sample with the time step dependent upon a delay of each delay element in the delay line.

Although other details thereof are not shown in the examples, it will be apparent that delay line circuitry may be particularly appropriate for inclusion into integrated circuits to allow accurate characterization of the circuit during testing. Such on-chip circuitry would be capable of measuring time periods associated with signals much more accurately and easily than external test circuitry. The integrated circuit may e.g. be provided with complex logic circuits, such as for example in a microprocessor, such as a general purpose microprocessor, a graphics processor, a microcontroller a digital signal processor or otherwise.

Figure 1:
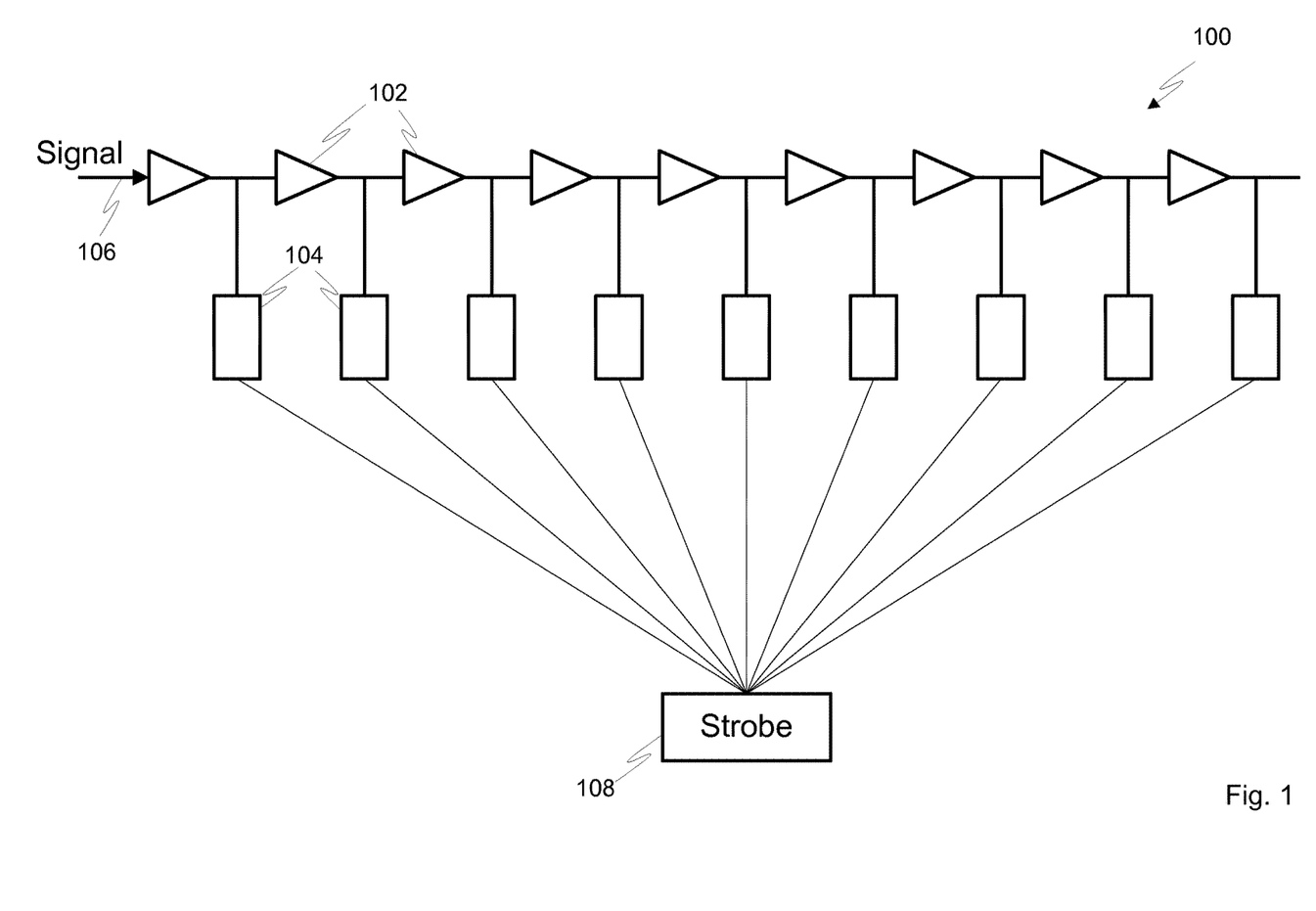
FIG. 1 schematically shows a block diagram of an example of a tapped delay line that can be used to measure a signal.

FIG. 1 illustrates a tapped delay line that can be used to obtain a plurality of samples of a signal with a small time step between each sample.

The delay line 100 is formed from a number of delay buffers 102, having identical delay times, connected in series. The output of each delay buffer 102 is also connected to a respective sample buffer 104 which samples the signal at the output of the delay buffer 102 when a strobe signal 108 is asserted at the sample buffer 104. Each pair of a delay buffer 102 and a respective sample buffer 104 can be considered as a sample stage, and multiple sample stages may be concatenated as required to provide a desired sample precision and size to allow an input signal to be measured.

In use, the delay line is first calibrated to measure the delay of each delay buffer, $T_d$. Then a signal of interest is applied to an input of the first delay buffer 102 of the delay line 100. When a specified test condition occurs, such as a certain time being reached or signal level being set, etc. the strobe 108 is set and each sample buffer 104 samples its respective delay buffer 102 output. The values stored in the sample buffers 104 can then be read to give a number of samples of the signal with a very small time step (equal to the delay of the delay buffers 102) between the captured samples. By observing signal level changes in the captured samples, timing information can be calculated based on the calibrated delay times of the delay buffers 102.

Figure 2:
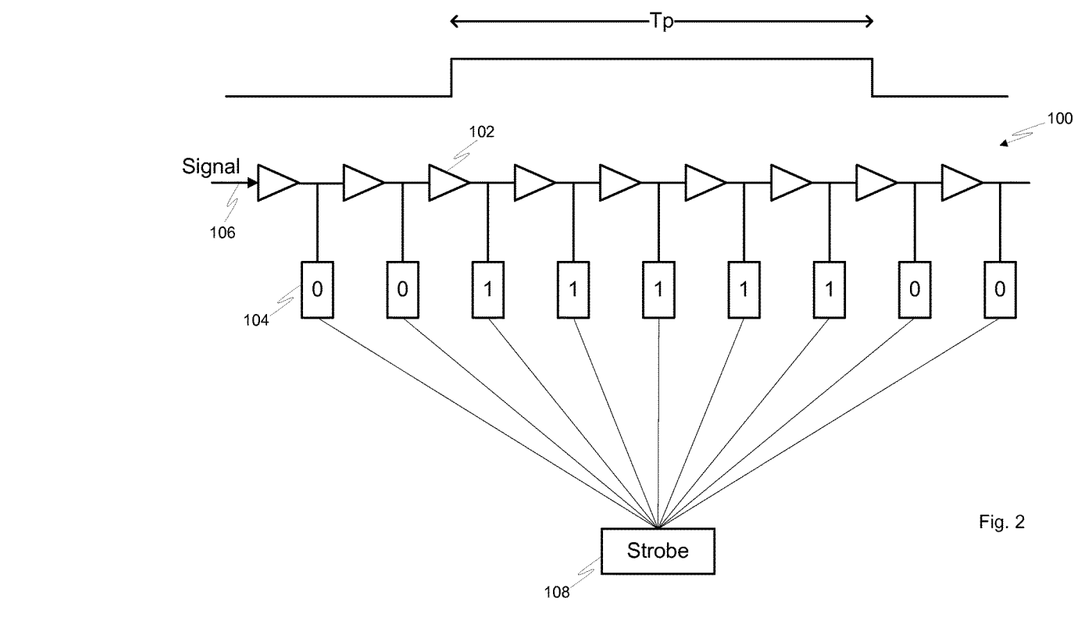
FIG. 2 shows a block diagram illustrating the example of FIG. 1 when a signal of interest has been applied to the delay line.

FIG. 2 illustrates the delay line 100 of FIG. 1 when a signal with a time period $T_p$ has been applied to the input of the delay line 100. A short time after the signal of interest has been applied to the delay line, the strobe signal 108 is asserted and the sample buffers 104 sample and hold the signal level at the output of each delay buffer 102. The resulting level can then be read from the sample buffers 104.

In the example shown in FIG. 2, the signal spans a total of five delay elements, as recorded in the third to seventh sample buffers 104 as a '1', with the transition from 0 to 1 and 1 to 0 marking the edges of the signal of interest 106. As the delay associated with each delay buffer, $T_d$, has been previously been determined during calibration of the delay line 100, the time period of the signal, $T_p$, can be calculated by multiplying the number of '1's, N, recorded by the sample buffers 104, in this case five, by $T_d$, i.e.:

$$T_p = N*T_d \tag{1}$$

However, using the tapped delay line of FIG. 1 it may be difficult to obtain a very large number of samples of the signal, which may be useful in some test scenarios. This is because for a very large number of sampling stages, it is difficult to provide a strobe signal that is sufficiently well balanced to allow the approach of FIG. 1 to be used.

For example, balancing of a strobe signal to one hundred sample buffers 104 within a 20 picosecond (ps) window is problematic but possible. However, for a delay line 100 formed from delay elements 102 having a delay of 10 ps, the use of one hundred sample buffers 104 gives a measuring window of just one nanosecond. It has been found to be difficult, if not impossible, to provide a longer measuring window using this technique.

Figure 3:
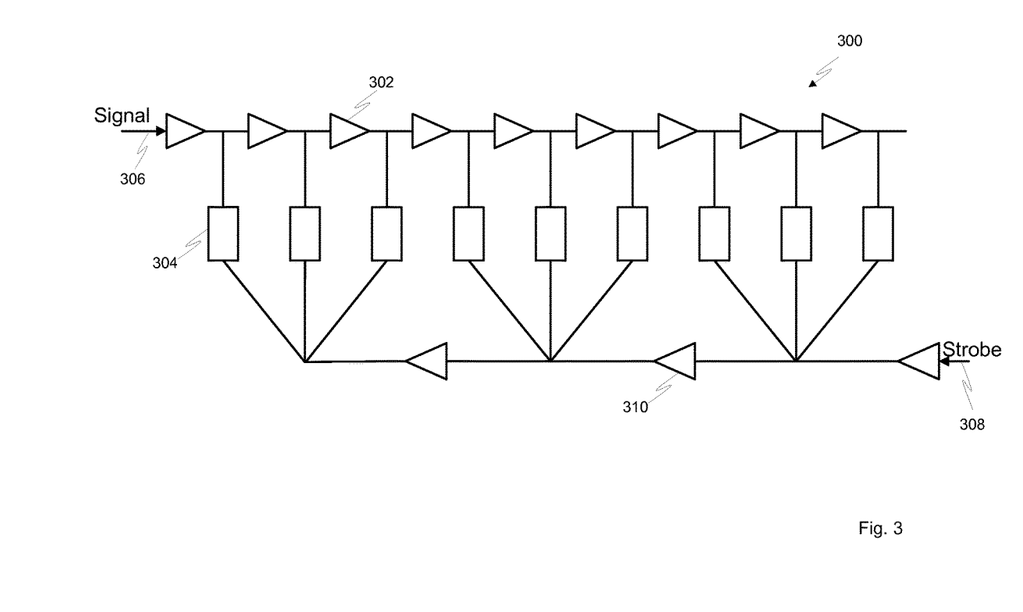
FIG. 3 schematically shows a block diagram illustrating an example of a tapped delay line including a propagated strobe tree.

FIG. 3 illustrates a modified tapped delay line 300 including a propagated strobe tree to distribute a strobe signal 308 to sample buffers, avoiding the need to use a balanced strobe signal. This allows a much simpler, more robust and repetitive design to be used to form a delay line of any length without the limitations imposed by the use of a balanced strobe signal.

In the tapped delay line 300 of FIG. 3, a number of sample stages comprising a delay buffer 302 and a respective sample buffer 204 are arranged in a similar arrangement as the delay line of FIG. 1. Strobe signal 308 is applied to a strobe propagation buffer 310, and the output of the strobe buffer 310 is used to control a number of sample buffers 304 and is applied to a further strobe propagation buffer 310. Thus, a number of adjacent sample stages are grouped to receive a strobe signal from a common strobe buffer, which each strobe buffer 310 controlling a different group of sample stages. In the example of FIG. 3, the strobe signal 308 is propagated in an opposite direction to the propagation of the signal of interest 306.

Calibration of the delay line elements in the example of FIG. 3 can be performed as for the delay line 100 discussed above. Calibration of the strobe propagation buffers 310 can be performed in a similar manner, by closing the strobe propagation line into a ring oscillator, or by "measuring" a known duration pulse after calibration of the delay line buffers 302. Alternatively, in some example embodiments, the strobe propagation buffers 310 may be designed to have the same delay as the delay buffers 302. This allows a one-step calibration to be performed for both the delay buffers 302 and the strobe propagation buffers 310, for example by calibrating the delay buffers 302 as described above, and may also simplify the calculation of signal times from the captured signal samples.

Using a propagated strobe tree as in the example of FIG. 3 allows a sampling delay line to be constructed of any length, with no limit caused by distribution of the strobe signal.

Figure 4:
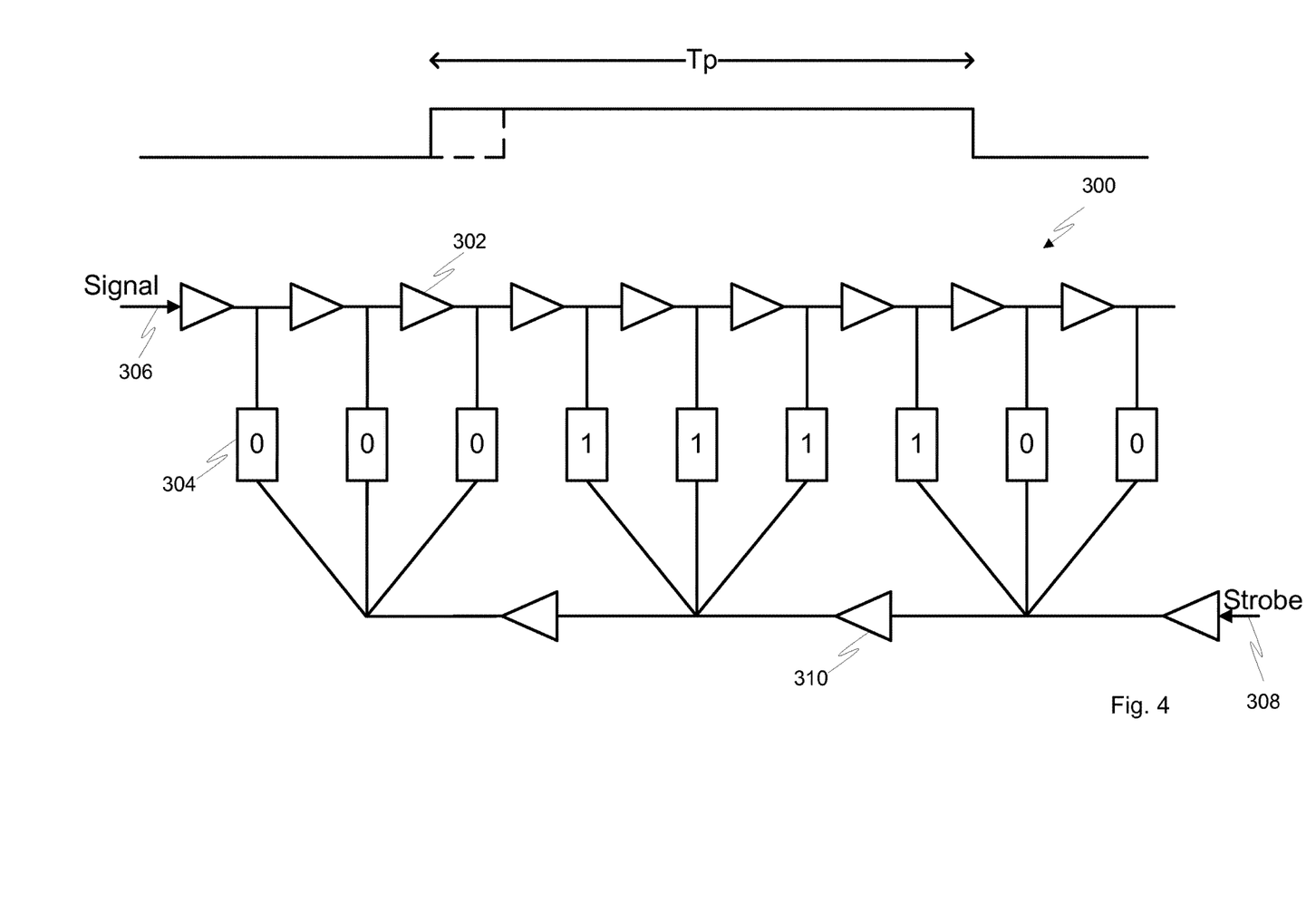
FIG. 4 schematically shows a block diagram illustrating the example of FIG. 3 when a signal of interest has been applied to the delay line.

Calculation of the time period of the signal in the example embodiment of FIG. 3 requires the delays in the strobe propagation to be taken into account. FIG. 4 shows the example embodiment of FIG. 3 when a signal of length $T_p$ has been applied to the input. In this case, due to the delay introduced to the propagation of the strobe signal 308 the sample buffers 304 do not capture all of the samples of the signal of interest at the same time. The continued progression of the signal 306 is illustrated by the dashed line in FIG. 4. This results in the number of '1's, N, being recorded in the sample buffers 304 being less than the number recorded in the example of FIG. 2 when the same signal is applied. Thus, for the example of FIG. 4, the delay caused by the strobe buffers 310 must be added to the delay calculated as for the example of FIG. 2.

The time period, $T_p$, of the signal can be estimated in the example of FIG. 4 using the equation:

$$T_p = N*T_d + N_s*T_s \tag{2}$$

where $T_p$ is signal period to be determined, N is the number of consecutive '1's stored in the sample buffers 304 after triggering by the strobe signal 308, $T_d$ is the calibrated delay of each delay buffer 302, $N_s$ is the number of strobe buffers 310 between the edges of the signal of interest 306 when it is captured. Thus, for the example shown in FIG. 4, the period $T_p$ of the signal 306 is equal to:

$$T_p = 4*T_d + 1*T_s \tag{3}$$

Alternatively, the delay attributable to the propagation of the strobe signal can be estimated by dividing the number of '1's recorded, N, by the number of sample buffers controlled by the output of each strobe delay buffer 310, G. Thus, the period of the signal can be estimated as:

$$T_p = N*T_d + \frac{N}{G}*T_s = N\left(T_d + \frac{T_s}{G}\right) \tag{4}$$

Figure 5:
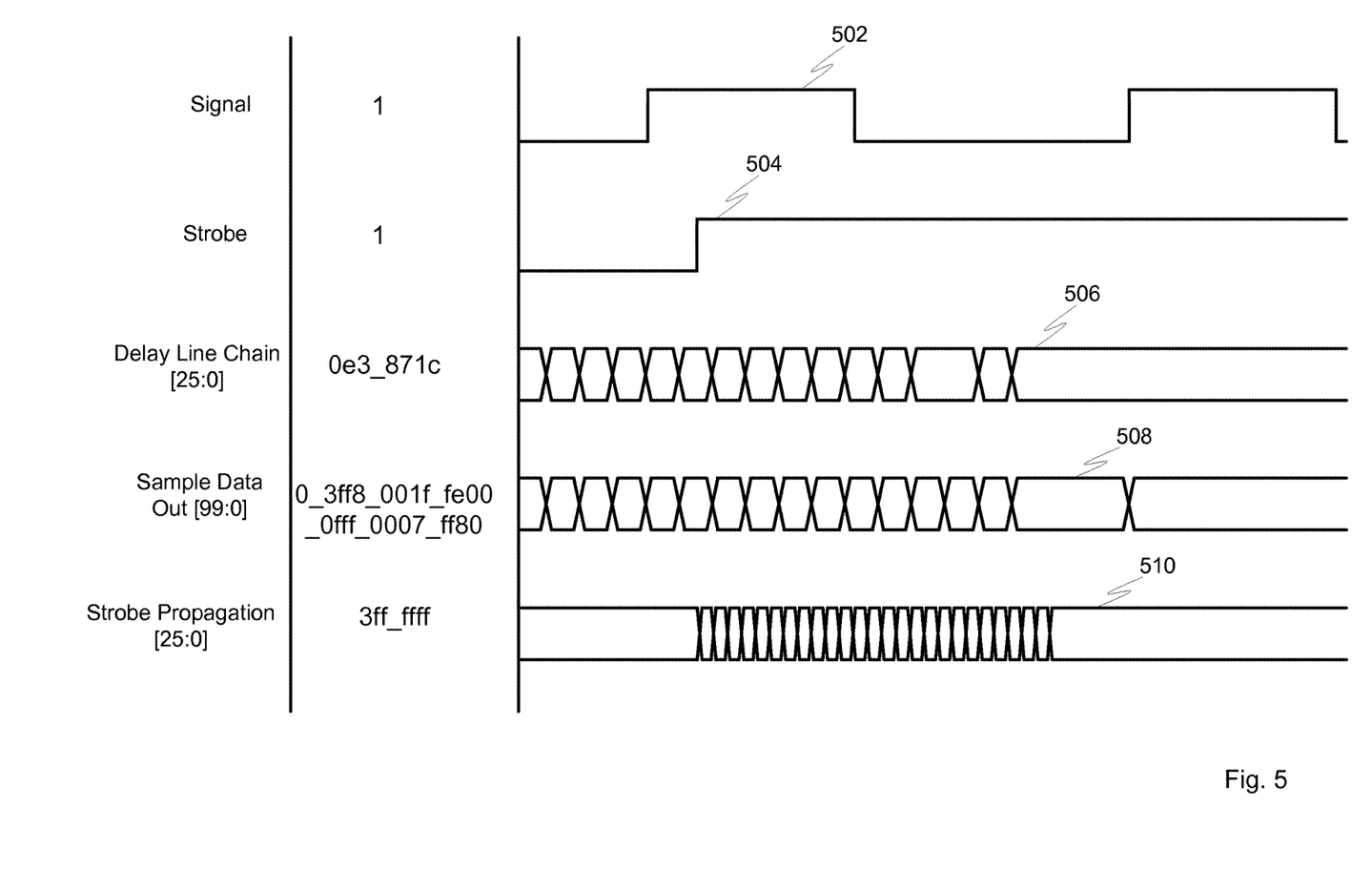
FIG. 5 shows a timing diagram illustrates waveforms for a simulated measurement of a signal according to an example embodiment.

FIG. 5 illustrates results obtain from a simulated delay chain similar to the example shown in FIG. 3. The top trace 502 illustrates the signal of interest applied to the delay line which propagates through the delay line as shown by trace 506. At a certain time, the strobe signal 504 is asserted, and the strobe signal then propagates through the strobe propagation tree, illustrated by trace 510. In the delay chain used to produce the results shown in FIG. 5, four sample buffers are controlled by the output of each strobe propagation buffer.

The original pulse width of the signal 502 is 270 ps with a total cycle width of 600 ps. The delay of each delay buffer is 10 ps ($T_d$=10 ps) and the strobe propagation buffers also had a delay of 10 ps ($T_s$=10 ps). The delay values of the delay buffers were calibrated by forming the delay line into a ring oscillator to give a measured delay of 9.96 ps. After the strobe signal 510 has been asserted and the positive edge of the strobe signal 510 propagated through the strobe propagation tree to each sample buffer, the sample buffers hold a snapshot of two or more pulses of the measured signal 502.

A binary representation of one pulse of the measured signal 502 is given as:
 binary: 00000000111111111111111111110000

A transition from '0' to '1' can be seen to occur in bit 8 (x=8) and a transition from '1' to '0' occurs in bit 30 (y=30), thus a pulse of the measured signal spans twenty two of the sample buffers, i.e. N=22. The pulse width of the measured signal can then be estimated using equation 4 as:

$$T_p = 22\left(9.96 + \frac{9.96}{4}\right) = 274 \text{ ps}$$

Thus, in the simulated example calculation based on the signals shown in FIG. 5, a good estimate of the original pulse width can be achieved using the described delay line and method.

Figure 6:
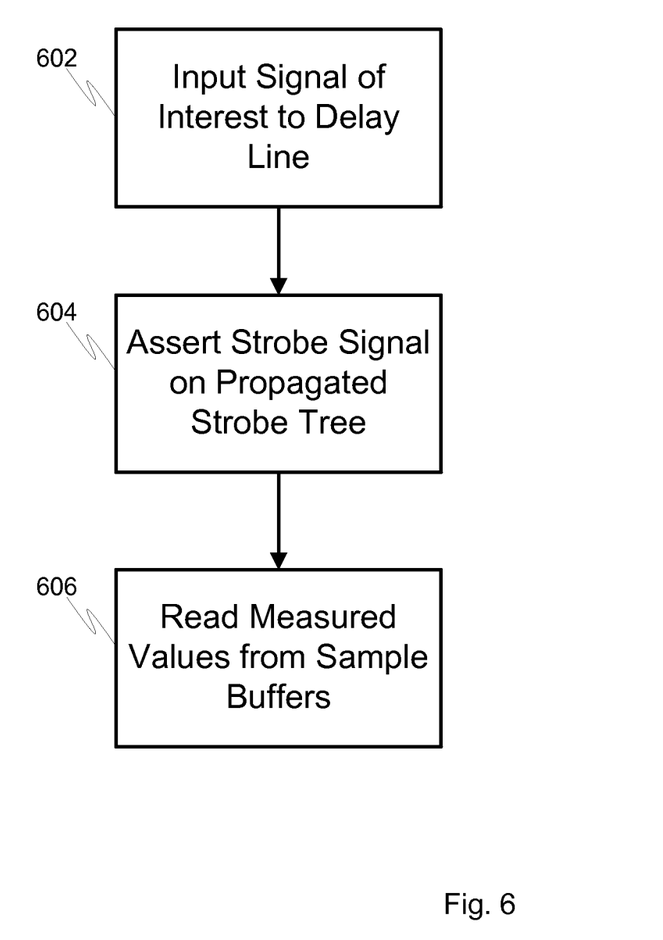
FIG. 6 shows a flowchart illustrating a method according to an example embodiment.

FIG. 6 illustrates a method of measuring a signal using a delay line such as the example described with reference to FIGS. 3 and 4. According to the method of FIG. 6, a signal of interest is applied to the delay line, 602, and at a desired time or based upon a trigger condition, the strobe signal is asserted on the propagated strobe tree, 604. The strobe signal is then propagated to each group of sample buffers in turn as the strobe propagates through the tree, capturing an instantaneous value of the signal at the sample buffers at the time the strobe signal reaches the each buffer. The sample values can then be read from the sample buffers, 606, to provide information on the original signal.

While the above example embodiments have been described as having certain numbers of sample buffers controlled by each strobe propagation buffer, for example three sample buffers to each strobe buffer as shown in FIG. 3, other embodiments are not so limited and may be implemented with any number. For example, in some examples each sample buffer may be controlled by a specific strobe propagation buffer, while in other examples a large number of sample buffers may be coupled to the output of each strobe buffer.

Figure 7:
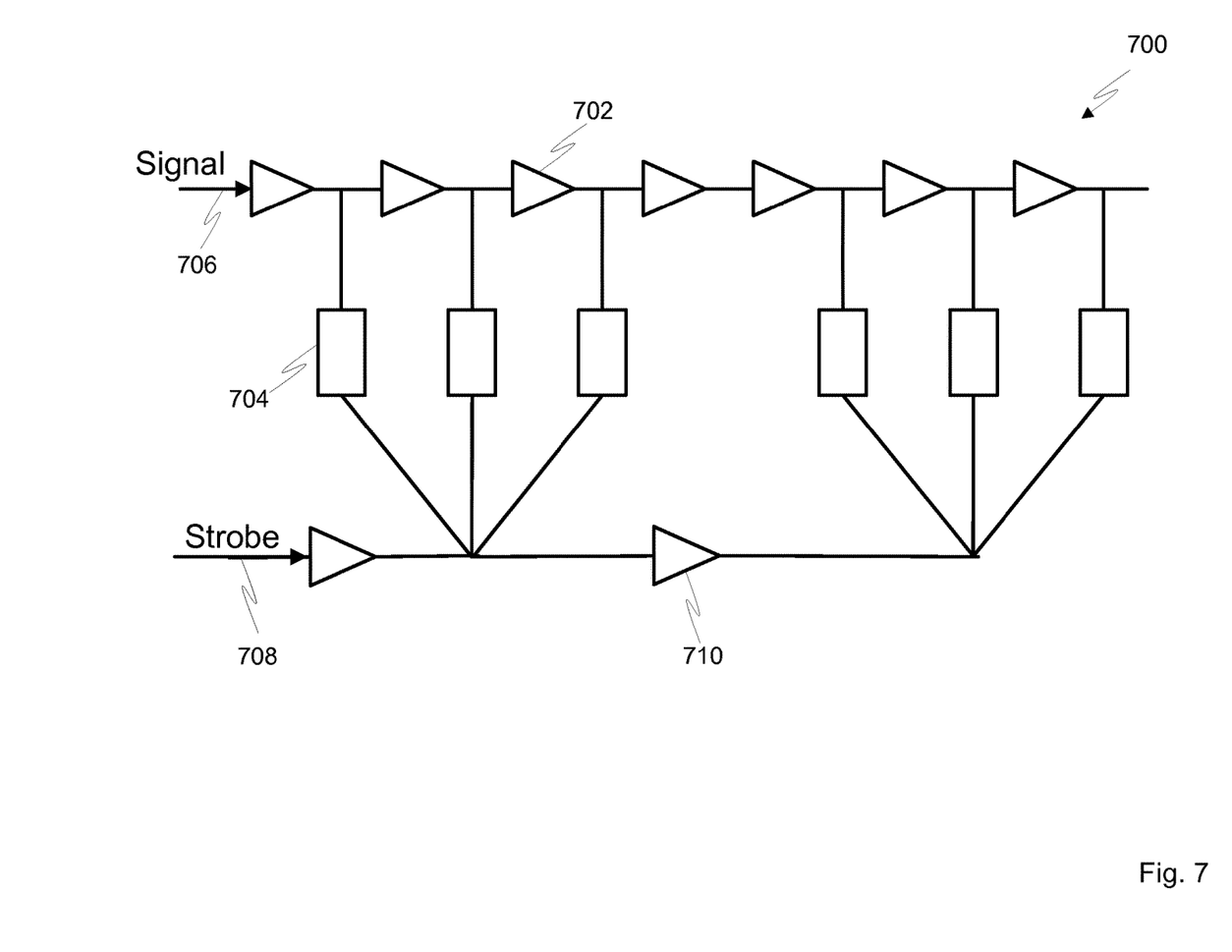
FIG. 7 schematically shows a block diagram of another example of a tapped delay line including a propagated strobe tree.

Furthermore, while in the example shown in FIG. 3 the strobe signal 308 is shown as propagating in the opposite direction through strobe propagation buffers 310 to the direction in which the signal of interest 306 propagates through the delay buffers 302, in other example embodiments the strobe signal may propagate in the same direction as the signal of interest. Such an example is illustrated in FIG. 7 which shows a tapped delay line 700 similar in concept to the delay line of FIG. 3. The example shown in FIG. 7 includes a number of groups of sample stages each sample stage including one or more delay buffers 702 with the output of each delay element coupled to an input of a respective sample buffer 704. Control of the sample time of the sample buffers in each group of sample stage is controlled by the output of a strobe propagation buffer 708 that propagates the strobe signal in the same direction as the signal of interest 706.

In the foregoing specification, the invention has been described with reference to specific examples of embodiments of the invention. It will, however, be evident that various modifications and changes may be made therein without departing from the scope of the invention as set forth in the appended claims, and that the claims are not limited to the specific examples.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

Unless otherwise stated as incompatible or the physics or otherwise of the embodiments prevent such a combination, the features of the following claims may be integrated together in any suitable and beneficial arrangement. This is to say that the combination of features is not limited by the claim forms, particularly the form of the dependent claims.

The invention claimed is:

1. An integrated circuit comprising a test circuit for sampling a signal on the integrated circuit, the test circuit comprising:
    a plurality of sample stages arranged in series, each sample stage comprising a delay element, and
        a sample element, wherein an input of the sample element is coupled to an output of the delay element; and
    a strobe line for controlling a sample time of the sample elements, wherein the strobe line comprises a plurality of strobe delay elements arranged in series, and an output of each strobe delay element is coupled to one or more sample elements, wherein a delay time of each of the delay elements is equal to a delay time of each of the strobe delay elements.

2. The integrated circuit of claim 1 wherein the output of the delay element of one sample stage is coupled to an input of the delay element of a subsequent sample stage.

3. The integrated circuit of claim 1, wherein a direction of increasing delay of the plurality of sample stages is opposite to a direction of increasing delay of the strobe line.

4. An integrated circuit comprising a test circuit for sampling a signal on the integrated circuit, the test circuit comprising:
    a plurality of sample stages arranged in series, each sample stage comprising a delay element, and
        a sample element, wherein an input of the sample element is coupled to an output of the delay element; and
    a strobe line for controlling a sample time of the sample elements, wherein the strobe line comprises a plurality of strobe delay elements arranged in series, and an output of each strobe delay element is coupled to one or more sample elements, wherein the output of each strobe delay element is coupled to a single sample element.

5. The integrated circuit of claim 1, wherein a delay time of each of the delay elements is not equal to a delay time of each of the strobe delay elements.

6. A method of sampling a signal, the method comprising:
    inputting the signal to a delay line comprising a plurality of delay elements; and
    sampling an output of each of the plurality of delay elements using a respective sample element, wherein a sample time of a first group of one or more sample elements is delayed relative to a sample time of a neighbouring group of one or more sample elements, wherein a delay time of each of the delay elements is equal to the delay in sample time between neighbouring groups of sample elements.

7. The method of claim 6, wherein
    the sample time of the sample element is controlled by a strobe signal carried by a strobe line;
    the strobe line comprises a plurality of strobe delay elements arranged in series; and
    an output of each strobe delay element is coupled to a group of one or more sample elements.

8. The method of claim 6 wherein the sample of time of the first group is delayed relative to a subsequent group of one or more delay elements in the delay line.

9. The method of claim 6, further comprising calibrating a delay time of the plurality of delay elements by configuring the delay line as a ring oscillator.

10. The method of claim 9, further comprising calibrating the delay in sample time between neighbouring groups of sample elements based on a calibrated delay time of the plurality of delay elements.

11. The method of claim 6 further comprising calculating a pulse width associated with the signal based on the sampled output of each of the plurality of delay elements.

12. The integrated circuit of claim 4 wherein the output of the delay element of one sample stage is coupled to an input of the delay element of a subsequent sample stage.

13. The integrated circuit of claim 4, wherein a direction of increasing delay of the plurality of sample stages is opposite to a direction of increasing delay of the strobe line.

14. The integrated circuit of claim 4, wherein a delay time of each of the delay elements is not equal to a delay time of each of the strobe delay elements.

* * * * *